United States Patent
Mayberry et al.

(10) Patent No.: US 11,137,214 B2
(45) Date of Patent: Oct. 5, 2021

(54) OSCILLATING HEAT PIPE USING ULTRASONIC ADDITIVE MANUFACTURING

(71) Applicant: Raytheon Company, Waltham, MA (US)

(72) Inventors: Travis L. Mayberry, Dallas, TX (US); Justin D. Wenning, Celina, OH (US)

(73) Assignee: Raytheon Company, Waltham, MA (US)

( * ) Notice: Subject to any disclaimer, the term of this patent is extended or adjusted under 35 U.S.C. 154(b) by 210 days.

(21) Appl. No.: 16/364,310

(22) Filed: Mar. 26, 2019

(65) Prior Publication Data

US 2020/0309466 A1   Oct. 1, 2020

(51) Int. Cl.
*F28D 15/02* (2006.01)
*B23K 20/10* (2006.01)
(Continued)

(52) U.S. Cl.
CPC .......... *F28D 15/0233* (2013.01); *B23K 20/10* (2013.01); *F28D 15/0275* (2013.01); *B23K 2101/14* (2018.08); *B33Y 10/00* (2014.12); *B33Y 80/00* (2014.12); *F28F 2275/065* (2013.01); *H05K 7/20336* (2013.01)

(58) Field of Classification Search
CPC ..... F28D 2015/0225; F28D 2015/0233; F28D 15/025; F28D 15/0266; F28D 15/043; F28F 3/048; F28F 3/08; F28F 13/02; F28F 2260/02; F28F 2275/065; H01L 23/427; H01L 23/473; H05K 7/20254; H05K 7/20281; H05K 7/20336; H05K 7/20636; H05K 7/20672; H05K 7/20772; H05K 7/20809; H05K 7/20872; H05K 7/20881;
(Continued)

(56) References Cited

U.S. PATENT DOCUMENTS 8,919,426 B2   12/2014   Hardesty
9,389,022 B2   7/2016   Agostini et al.
(Continued)

FOREIGN PATENT DOCUMENTS

CN   104180696 B   1/2016
KR   101508126 B1   4/2015

OTHER PUBLICATIONS

Ultrasonic Additive Manufacturing _ Fabrisonic Fabrisonic.pdf (Year: 2017).*
(Continued)

*Primary Examiner* — Jianying C Atkisson
*Assistant Examiner* — Jose O Glass-Quinones
(74) *Attorney, Agent, or Firm* — Renner, Otto, Boisselle & Sklar, LLP

(57) ABSTRACT

A manifold structure is formed using ultrasonic additive manufacturing and machining. The manifold structure includes a body having a base plate and a cover plate that define a flow passage therebetween, and a plurality of walls that segment the flow passage into a plurality of channels, wherein each of the walls has a height extending from the base plate to the cover plate and a non-linear length that is elongated relative to a width of the wall and extends in a direction normal to the height of the wall. The walls are wavy in shape to provide enhanced rigidity and stiffness during lamination over the channels.

15 Claims, 6 Drawing Sheets

(51) Int. Cl.
     *B33Y 10/00*     (2015.01)
     *B33Y 80/00*     (2015.01)
     *B23K 101/14*    (2006.01)
     *H05K 7/20*      (2006.01)

(58) Field of Classification Search
     CPC ........... H05K 7/20927; H05K 7/20936; H05K 7/20981; H05K 7/2099
     See application file for complete search history.

(56) References Cited

U.S. PATENT DOCUMENTS

| | | |
|---|---|---|
| 9,750,160 B2 | 8/2017 | Short, Jr. et al. |
| 9,863,716 B2 | 1/2018 | Kokas et al. |
| 9,909,817 B2 | 3/2018 | Agostini et al. |
| 9,936,607 B2 | 4/2018 | Chainer et al. |
| 10,043,730 B2 | 8/2018 | Refai-Ahmed et al. |
| 10,086,564 B2 | 10/2018 | Batchelder et al. |
| 10,098,259 B2 | 10/2018 | McLaughlin et al. |
| 10,100,740 B2 | 10/2018 | Thomas |
| 2016/0230595 A1 | 8/2016 | Wong |
| 2017/0304964 A1 | 10/2017 | Andersen |
| 2018/0015539 A1 | 1/2018 | Versluys |

OTHER PUBLICATIONS

International Search Report and Written Opinion for corresponding International Application PCT/US2020/021333—dated Jun. 18, 2020.

\* cited by examiner

OSCILLATING HEAT PIPE USING ULTRASONIC ADDITIVE MANUFACTURING

FIELD OF THE INVENTION

The invention relates to structures manufactured using ultrasonic additive manufacturing, and more particularly, forming structures with free spaces using ultrasonic additive manufacturing.

DESCRIPTION OF THE RELATED ART

Ultrasonic additive manufacturing (UAM) is an additive sheet lamination technique in which foils (metallic, non-metallic, composite, etc.) are attached to one another to form a solid structure. The solid structure may be a free-standing structure or an added part to an existing solid part. The UAM process is a solid-state metal deposition process that enables the build-up of metal components to form the structure. During the UAM process, high-frequency ultrasonic vibrations are applied to metal foil materials to break away the oxide layers on metal foils and create a solid-state weld. Relatively large forces are applied to the metal foils to hold the foils together and form a metallurgical bond between the foils. The UAM process thereby requires a sufficiently stiff substrate from which to build on in order to react these relatively large forces.

UAM may be used to form structures having complex internal features. UAM may be particularly advantageous in forming a structure having internal cavities, such as a structure that provides heating or cooling for a surface to which the structure is affixed. For example, known heat pipes, such as oscillating heat pipes (OHPs), may be formed using a combination of manufacturing processes that requires both UAM and brazing. The OHPs are manufactured using multiple operations including heat treating a base plate material, machining straight channel walls into a base plate material, brazing the material, machining further features into the structure after the braze, re-heat treating the parts, and final machining.

Using multiple operations to manufacture the OHPs is disadvantageous in that the overall manufacturing process includes a long lead time, multiple facilities or machine locations are required to perform all of the different operations, and more points of potential failure during the manufacturing process are present. However, conventional straight walled channels of the OHPs are suitable for brazing, but not suitable for other more efficient manufacturing processes. For example, due to the limitations in strength and stiffness of the channel walls, using other manufacturing processes may result in deformation of the channel walls which may subsequently have adverse effects on fluid flow through the channels.

SUMMARY OF THE INVENTION

A manifold structure having non-linear or wavy channel walls provides improved stiffness of the walls during ultrasonic additive manufacturing (UAM) or lamination of layers over the channel walls. The formed manifold structure also has improved stiffness due to the wavy channel walls. A solid body or base plate material is built up in a layer-by-layer UAM process. A wavy or sinusoidal pattern of channel walls defining fluid flow paths is then machined in the base plate with the sinusoidal shape extending along the length of the channel walls in the direction of fluid flow through the manifold structure. The sinusoidal pattern of the channel walls provides adequate stiffness that enables a cover plate to be formed over the channel walls, using UAM, to enclose the channels. Using the wavy channel walls enables the formed manifold structure to have base plates and cover plates that are substantially more parallel with each other in a multi-level manifold structure having stacked channels.

The wavy channel walls are formed to define a period in the lengthwise direction and amplitude in the widthwise direction, with the period being greater than the amplitude. The period and amplitude may be selected to achieve a predetermined stiffness and rigidity of the channel walls. Using the wavy channel walls is advantageous in that the overall thermal performance of the manifold structure may only be slightly impacted since the period and amplitude may be minimal to achieve increased stiffness as compared with conventional straight channel walls. The wavy channel walls may be applicable in various heating and cooling applications such as in oscillating heat pipes (OHPs), or pulsating heat pipes, that are configured for passive heat spreading or in micro-channel coolers or coldplates that have even smaller diameters and are configured for active heat spreading.

Forming the wavy channel walls is further advantageous in that the manifold structure may be formed of multi-materials and softer materials which would not be suitable for use with manifold structures such as OHPs formed by conventional manufacturing processes. The manifold structure may include multi-materials for enhancing thermal performance and functionality of the structure. For example, heat spreaders, thermal interface materials, thermal insulator, and stiffening plates may be added to an OHP having wavy channels.

Still another advantage of using wavy channels within the manifold structure includes enabling a less complex manufacturing process for the manifold structure since a brazing step in the process may be eliminated and the UAM process and machining process may be performed by one machine. Accordingly, the overall lead time for manufacturing the manifold structure may be reduced. Using the UAM and machining processes also removes thermal post processing steps in forming the manifold structure since the temper and mechanical properties of both the base plate material and feedstock foil are maintained throughout the manufacturing process. Maintaining the temper condition and the material properties is enabled since the UAM process occurs at a lower temperature process as compared with conventional manufacturing processes.

According to an aspect of the invention, an additively manufactured manifold structure includes wavy channel walls.

According to an aspect of the invention, a multi-level manifold structure has vertically stacked channels with wavy channel walls.

According to an aspect of the invention, an oscillating heat pipe, or pulsating heat pipe, includes wavy flow channel walls.

According to an aspect of the invention, a microchannel cooler or coldplate includes wavy flow channel walls.

According to an aspect of the invention, a manifold structure includes a body having a base plate and a cover plate that define a flow passage therebetween, and a plurality of walls that segment the flow passage into a plurality of channels, wherein each of the walls has a height extending from the base plate to the cover plate and a non-linear length that is elongated relative to a width of the wall and extends in a direction normal to the height of the wall.

According to an embodiment of any paragraph(s) of this summary, each of the walls has a wavy shape.

According to an embodiment of any paragraph(s) of this summary, the walls are arranged in a corrugated pattern.

According to an embodiment of any paragraph(s) of this summary, each of the walls is sinusoidal in shape and defines a period in a lengthwise direction and an amplitude in a widthwise direction.

According to an embodiment of any paragraph(s) of this summary, the period is defined between two peaks, and wherein each of the two peaks is angled between 0 and 45 degrees in the widthwise direction relative to a depression between the two peaks.

According to an embodiment of any paragraph(s) of this summary, the period is greater than the amplitude.

According to an embodiment of any paragraph(s) of this summary, the amplitude is between 0.7 and 2.1 millimeters.

According to an embodiment of any paragraph(s) of this summary, the period is between 1.0 and 2.3 millimeters.

According to an embodiment of any paragraph(s) of this summary, the walls are arranged in a serpentine pattern.

According to an embodiment of any paragraph(s) of this summary, the base plate and the cover plate are parallel to each other.

According to an embodiment of any paragraph(s) of this summary, the channels are oscillating heat pipe channels that are formed in the base plate and configured for two-phase passive heat spreading.

According to an embodiment of any paragraph(s) of this summary, the channels are micro-channels that are configured for single-phase forced liquid convection.

According to an embodiment of any paragraph(s) of this summary, the manifold structure is a multi-level structure in which the plurality of channels includes stacked channels.

According to another aspect of the invention, a method of forming a metal manifold structure includes using an ultrasonic additive manufacturing process to build up a solid structure having a base plate by applying foils in a layer-by-layer process, and machining the solid structure to form a cavity that defines a flow passage and a plurality of walls that segment the flow passage into a plurality of channels, wherein each of the walls has a height extending from the base plate to the cover plate and a non-linear length that is elongated relative to a width of the wall and extends in a direction normal to the height of the wall, and using the ultrasonic additive manufacturing process to enclose the channels with a cover plate that is opposite the base plate.

According to an embodiment of any paragraph(s) of this summary, the method includes maintaining an original temper condition of the foils during the ultrasonic additive manufacturing process.

According to an embodiment of any paragraph(s) of this summary, the method includes forming each of the walls to be wavy in shape and define a period in a lengthwise direction and an amplitude in a widthwise direction, wherein the period is greater than the amplitude.

According to an embodiment of any paragraph(s) of this summary, the method includes forming each of the walls to define the period between two peaks, wherein each of the two peaks is angled between 0 and 45 degrees in the widthwise direction relative to a depression between the two peaks.

According to an embodiment of any paragraph(s) of this summary, the method includes forming the channels as oscillating heat pipe channels in the base plate, and arranging the oscillating heat pipe channels for two-phase passive heat spreading across the metal manifold structure.

According to an embodiment of any paragraph(s) of this summary, the method includes forming the channels as micro-channels, and arranging the micro-channels for single-phase forced liquid convection across the metal manifold structure.

According to an embodiment of any paragraph(s) of this summary, the method includes using the ultrasonic additive manufacturing process and machining process to stack a plurality of channels in a direction that is normal to the base plate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein have particular application in heating and cooling structures that are formed using an ultrasonic additive manufacturing (UAM) process. UAM is advantageous in forming cooling manifold structures due to the capabilities of UAM in producing smooth complex internal features within metallic materials. Examples of complex internal features that may be formed by UAM include internal pipes or channels and enclosed cavities. A cooling manifold structure formed by UAM may be implemented in various applications, and in particular, aerospace applications such as in radar structures that have electronics to be cooled. Circuit cards and other electronics may be suitable. Applications that use two-phase passive heat spreading, such as oscillating heat pipes (OHPs), which are also known as pulsating heat pipes, may be suitable. Other applications using single-phase forced liquid convection, such as microchannel coolers or cold plates which have micro-channels with diameters smaller than those of OHPs, may also be suitable. OHPs or pulsating heat pipes may have microchannels. Many other applications may be suitable and the metal manifold structures may be scaled up or down depending on the application.

A manifold structure according to the present application may be affixed or formed on a surface or structure to be thermally controlled or regulated. The surface may be a heat-dissipating surface, but in other exemplary applications, the manifold structure may be used to heat a cooled surface. Using machined wavy channel walls to support subsequent UAM lamination over the channel walls enables channels to be stacked in a direction normal to the direction of heat flow such that the structure may be a multi-level manifold structure. The wavy channel walls provide improved stiffness of the walls, e.g. the rigidity of the walls in resisting deformation, during the high force exerted against the channel walls during the UAM process used to enclose the channels. The formed manifold structure also has enhanced stiffness. Although brazing may be subsequently performed to form additional features in the manifold structure, brazing is not required as the wavy channels enable an improved manifold structure to be formed using only the UAM process and machining.

Figure 1:
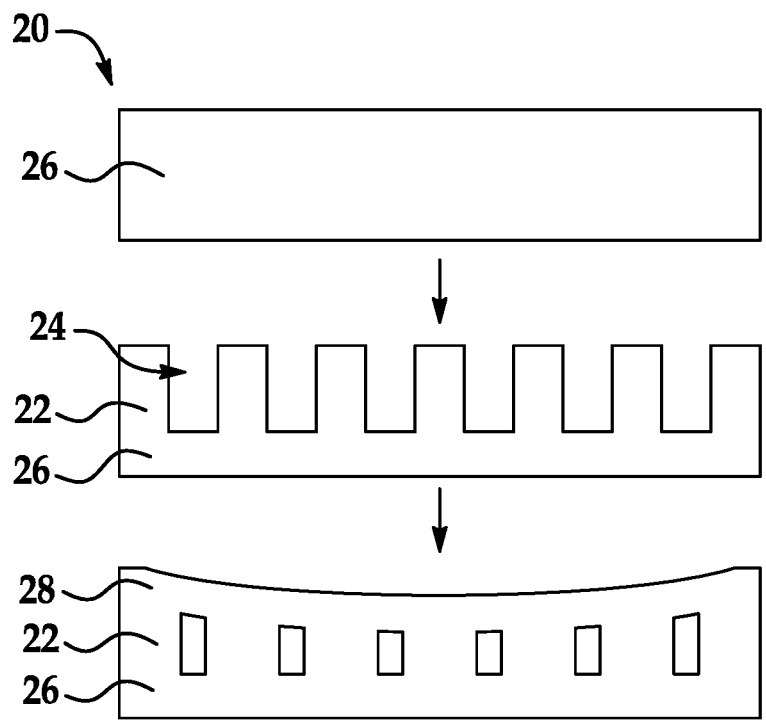
FIG. 1 is a drawing showing a front view of a conventional manifold structure having a plurality of fluid flow channels.
Figure 2:
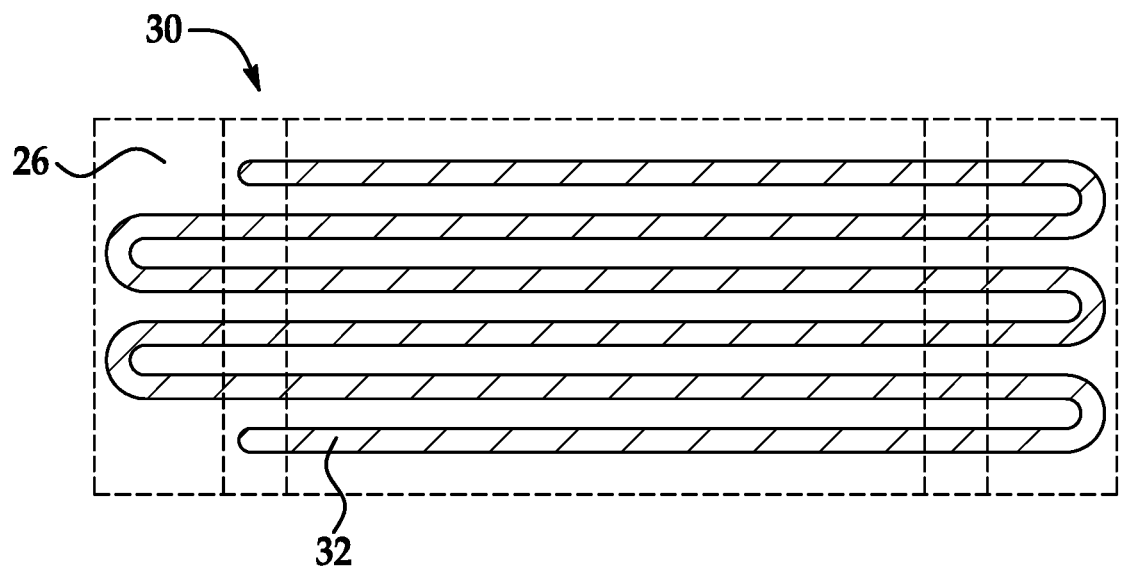
FIG. 2 is a drawing showing a sectional view of a conventional oscillating heat pipe having straight wall channels.

FIGS. 1 and 2 each show a conventional manifold structure 20, 30 having straight walls and straight channels. As shown in FIG. 1, the conventional manifold structure 20 has at least one straight channel wall 22 and at least one straight channel 24. FIG. 1 also schematically shows a manufacturing process for the conventional manifold structure 20. The conventional manifold structure 20 includes a solid metal base plate 26 and each straight channel 24 is cut into the base plate 26. Each straight channel wall 22 extends normal to the base plate 26 and to a direction of fluid flow through the manifold structure 20. After forming the straight walls and straight channels, a subsequent manufacturing process is used to enclose the straight channels with a cover plate 28. Due to the large force exerted vertically downward against the straight channels 24 during the subsequent manufacturing process, which may be a UAM process, the cover plate 28 is forced into the straight channels and crushes the straight walls. Accordingly, the resulting manifold structure 20 may have an undesirable shape which negatively impacts fluid flow through the manifold structure.

FIG. 2 shows a known OHP 30 having straight channel walls and straight channels that extend in a lengthwise direction of the base plate 26 and are formed in a serpentine pattern. The known OHP 30 is formed by machining the channels into the base plate 26 for brazing, brazing the materials together, machining additional features after brazing, heat-treating the materials, and final machining. The known OHP 30 is generally limited to a single material during the braze process such that the thermal performance and functionality features of known OHPs may not be enhanced by adding additional features formed of other metal materials. Due to the material removal from the core of the base plate 26, the formed OHP 30 may lack a preferred rigidity.

Figure 3:
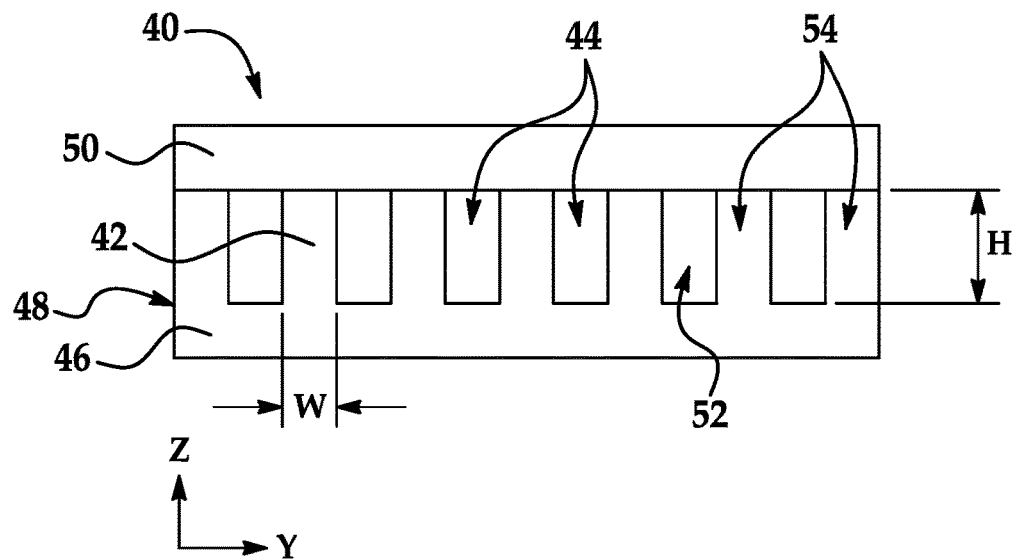
FIG. 3 is a drawing showing a front view of a manifold structure having a plurality of fluid flow channels according to the present application.
Figure 4A:
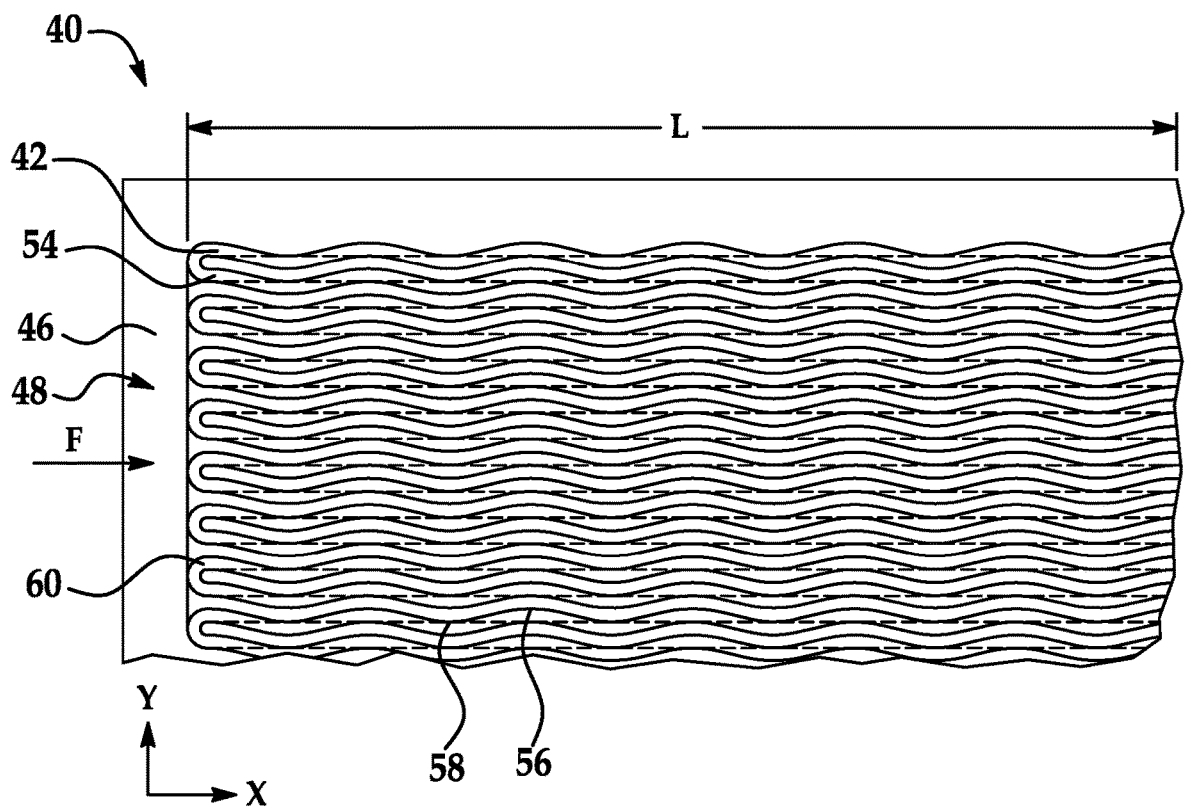
FIG. 4A is a drawing showing a top sectional view of the wavy channels of the manifold structure of FIG. 3.
Figure 4B:
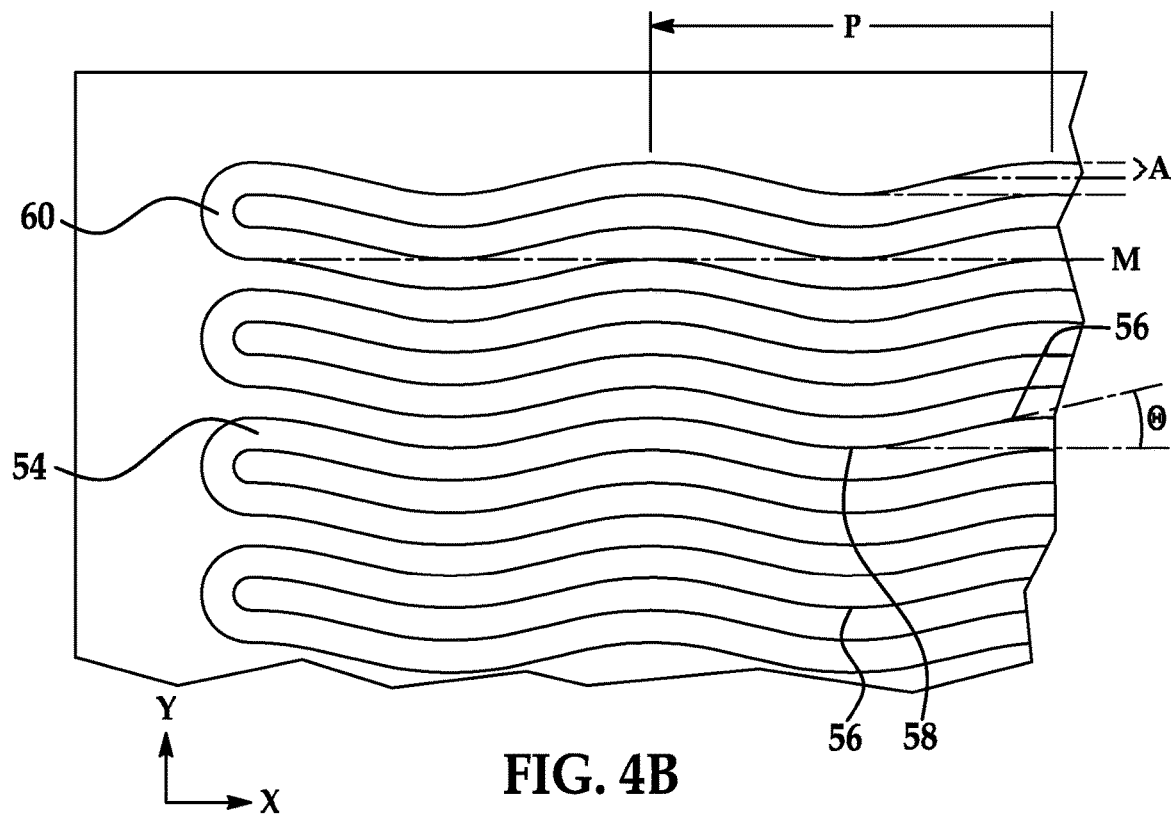
FIG. 4B is a drawing showing a detailed top sectional view of the wavy channels of FIG. 4A.
Figure 5:
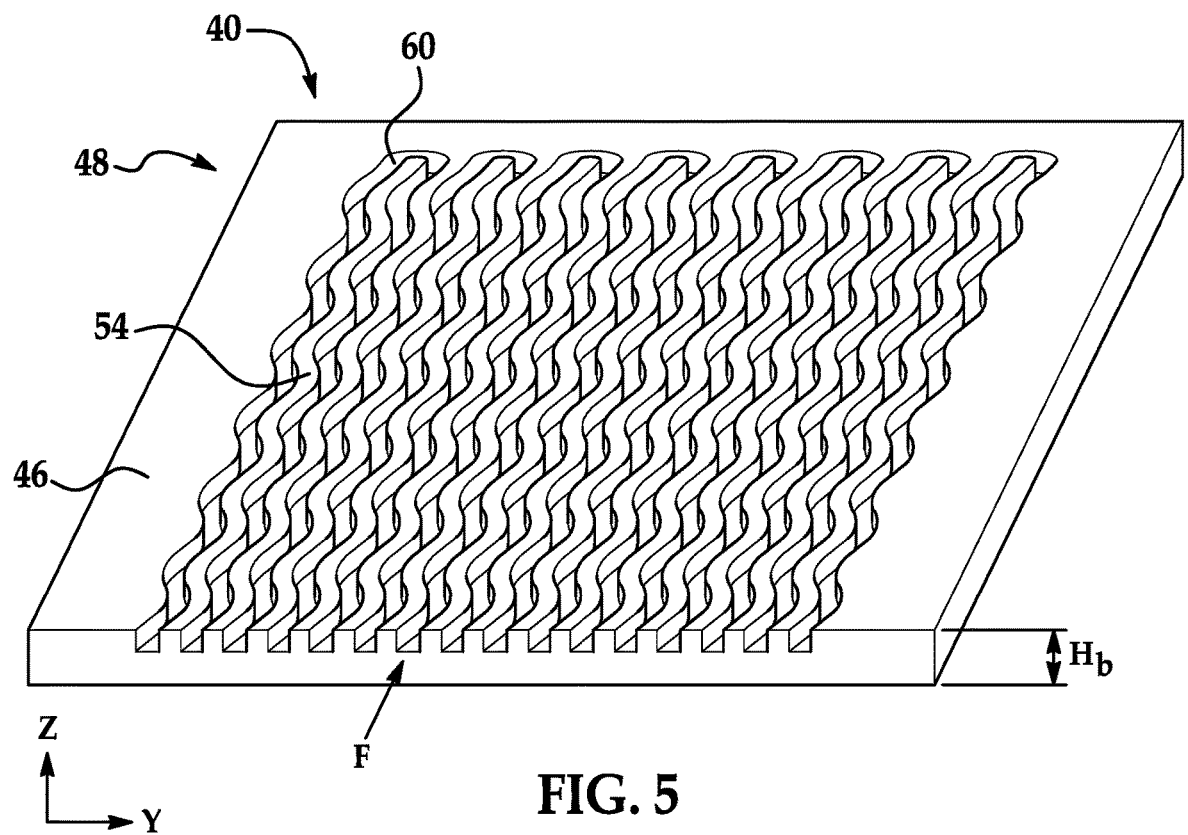
FIG. 5 is a drawing showing an oblique of the manifold structure of FIG. 4A.

Referring now to FIGS. 3-5, a manifold structure 40 having non-linear or wavy channel walls according to the present application is shown. FIG. 3 shows a front view of a portion of the manifold structure 40 in which each wavy channel wall 42 and wavy channel 44 is formed on a base plate 46. FIG. 4A shows a top sectional view of the manifold structure 40 and FIG. 4B shows a detailed view of FIG. 4A. FIG. 5 shows an oblique view of the manifold structure 40. The manifold structure 40 includes a main and solid body 48 that is built up using UAM and includes the base plate 46 and a cover plate 50 which encloses the wavy channels, as best shown in FIG. 3. A flow passage 52 is defined between the base plate 46 and the cover plate 50 and the flow passage 52 is segmented into the plurality of flow channels defined between each wavy channel wall 42. The channel walls and channels may be formed by a machining process that is performed after the solid body 48 is built up.

Each wavy channel wall 54 has a height H that extends from the base plate 46 to the cover plate 50 and a width W that extends in a direction normal to the height H. The width W may extend in a horizontal direction and the height H may extend in a vertical direction such that the channels are vertically arranged on the base plate 46. Fluid flow F travels through the flow passage 52 and the flow channels 44 in a direction that is parallel with the base plate 46 and the cover plate 50 and normal to both the direction in which the height H of each wall 54 extends and the direction in which the width W of each wall 54 extends. The fluid flow F may travel in a horizontal direction through the manifold structure 40. In an exemplary embodiment, the height H may extend in a z-direction, the width W may extend in a y-direction and the fluid flow F may travel in an x-direction.

Each wavy channel wall 54 has a length L that extends in a direction normal to the height H and the width W. The length L of each wall 54 is elongated relative to the width W of the wall 54. The fluid flow F travels in the direction of the length L of each wall 54 such that the wavy pattern of the channel walls extends in the flow path of the manifold structure 40. For example, the length L may extend in the x-direction, which may be the horizontal direction that is normal to the vertical direction in which the height H of the channel walls extends. When the manifold structure 40 is affixed to or formed on the heat-dissipating surface for cooling the surface, the length L of the channel walls may extend between a hot side of the heat-dissipating surface to a cold side or colder component. The wavy channel walls and wavy channels may be arranged in a corrugated pattern in contrast to the straight walls and straight channels of conventional manifold structures as shown in FIGS. 1 and 2, such that the stiffness of the channel walls is improved for building up the manifold structure 40.

Each wavy channel wall 54 may have a plurality of alternating bends such that the wavy channel wall 54 has a shape that is a zigzag type shape, a rickrack type shape, a meandering shape, etc. The shape of each channel wall 54 may be sinusoidal in the widthwise direction of the wall 54 such that the channel wall 65 has concave and convex curvatures. The sinusoidal shape includes peaks 56 that are an outermost point of the channel wall 54 relative to a median M of the channel wall 54. The median M of the channel wall 54 is the middle width such that peaks 56 extend outwardly from the median M in opposite directions at an equal distance. As shown in FIG. 4B, the peaks 56 may be displaced in the widthwise direction or in the y-direction relative to the median M.

The sinusoidal or wavy shape of each wavy channel wall 54 defines a period P in the lengthwise direction between peaks 56 that are on a same side of the channel wall 54 and an amplitude A in the widthwise direction that is defined as half the distance between a peak 56 and an adjacent depression 58. The depression 58 is a recessed portion that is recessed in the widthwise direction away from two peaks 56. The depression 58 is located at a lengthwise middle point between two peaks 56 arranged on the same side of the channel wall 54. The depression 58 may have a convex curvature and the peaks 56 adjacent to the depression 58 may each have a concave curvature such that the peaks and depressions are alternating in the lengthwise direction. In the widthwise direction or y-direction of the channel wall 54, a peak 56 and a depression 58 oppose each other on opposing sides of the channel wall 54. The period P is greater than the amplitude A and any suitable amplitude and period may be used. The amplitude and the period may be minimized to optimize the stiffness of the channel walls and the fluid flow through the channels. Each peak 56 may be angled by an angle θ relative to an adjacent depression 58. The angle θ may be between 0 and 45 degrees.

In an exemplary embodiment, the amplitude A may be between 0.7 and 2.1 millimeters (between 0.02 and 0.08 inches), and the period P may be between 1.0 and 2.3 millimeters (between 0.03 and 0.09 inches). Each channel wall 54 may have a thickness in the widthwise direction that is between 0.6 and 1.1 millimeters (between 0.02 and 0.05 inches). The height-to-width ratio of each wall 54 may be less than one-to-one such that the arrangement of the elongated channel walls maximizes the working surface area for supporting layers of the manifold structure 40 while minimizing the surface area that would disrupt flow through the channels. As shown in FIG. 5, the channel walls may not extend past a height $H_b$ of the base plate 46 such that the channels walls are retained within the base plate 46. The channel walls may be integrally formed within the body of the base plate 46. The wavy channel walls may be sized up or down depending on the application. For example, OHPs may have larger diameters as compared with micro-channels.

In an exemplary embodiment in which the manifold structure 40 is in the form of an OHP, each wavy channel wall 54 may have a serpentine pattern such that each wall 54 has a bend or a u-turn portion 60 connected with an adjacent wall. Each wall 54 may have a repeating pattern or ordered pattern of amplitudes and periods along the length L of the wall 54. In exemplary embodiments, the channel walls may be arranged to be parallel with each other and each channel wall 54 may have the same amplitude and period. The wavy channel walls may be formed uniformly and equally spaced from each other. In other embodiments, each channel wall 54 may have different amplitudes and periods along the length L of the wall 54 and relative to the other walls. The amplitudes and periods may be selected to obtain a particular stiffness and rigidity within the manifold structure 40 to withstand a particular force.

Forming the channel walls to have a sinusoidal shape is advantageous in that each channel wall 54 has an improved stiffness and rigidity for withstanding a vertical force exerted against the channel wall 54 during subsequent manufacturing of the manifold structure 40. The amplitude may be directly proportional to the stiffness of the channel walls such that increasing the amplitude may increase the stiffness of the channel walls. The channel diameters, thickness of the channel walls, amplitudes, and periods may be selected to achieve predetermined heat transfer characteristics within the manifold structure 40. For example, increasing the thickness of the walls may increase the rigidity of the channel walls, which is also proportional to the amount of force or pressure that the channel walls can withstand during UAM lamination over the channel walls. In addition to being advantageous during the UAM process, the improved stiffness and rigidity of the channel walls also results in a formed or finished manifold structure 40 that has improved features. As best shown in FIG. 3, using wavy channel walls enables the formed cover plate 50 to be parallel with the base plate 46, in contrast to the bowed cover plate 28 of the conventional manifold structure 20 shown in FIG. 1. The plates 46, 50 are substantially flat and planar such that the geometry is optimal for fluid flow through the manifold structure 20.

The manifold structure 40 having wavy channel walls and channels according to the present application may be suitable for use in either a passive heat transfer device or in an active heat transfer device. When the manifold structure 40 is used in a passive heat transfer application, the wavy channels may be OHPs that are machined or cut into the base plate 46 and configured for two-phase passive heat spreading across the manifold structure 40. When the manifold structure 40 is used in an active heat transfer application, the wavy channels may be micro-channels that have smaller diameters than OHPs and are connected to a source of pumped fluid. The micro-channels are configured for single-phase forced liquid convection across the manifold structure 40.

Figure 6:
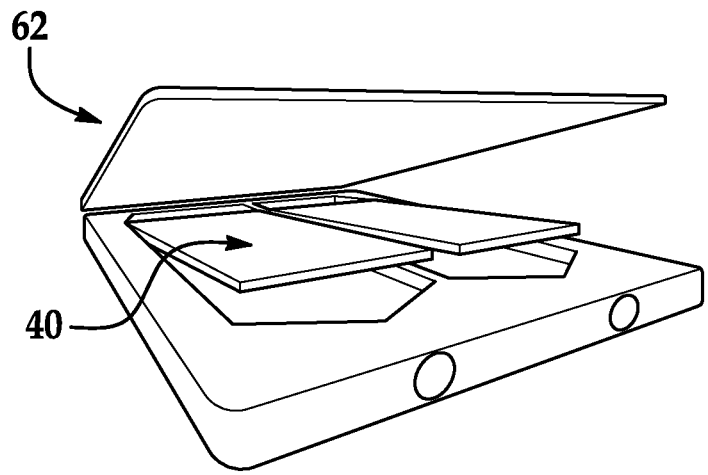
FIG. 6 is a drawing showing an oblique view of an exemplary application for the manifold structure of FIG. 3.
Figure 7:
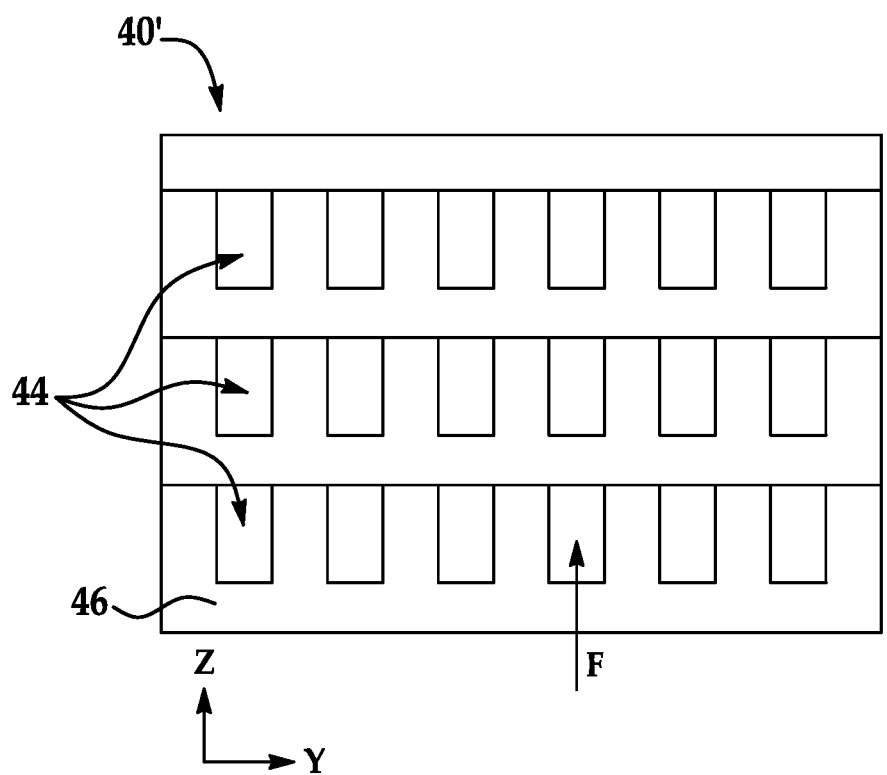
FIG. 7 is a drawing showing a multi-level manifold structure having a plurality of stacked channels according to the present application.

Referring in addition to FIGS. 6 and 7, the manifold structure 40 may be suitable for use in any heat exchanger type structure. For example, as shown in FIG. 6, the manifold structure 40 may be suitable for use in a cold plate 62 having micro-channels, such as in cooling smaller scale electronics. Forming the wavy channel walls to have sinusoidal shapes is also advantageous in that the structure can more efficiently be built up to form a multi-level manifold structure 40', as shown in FIG. 7. The multi-level manifold structure 40' includes a plurality of stacked channels that are normal to the direction of fluid flow F. Using the multi-level manifold structure 40' is advantageous in that the multi-level manifold structure 40' provides for a shorter and more direct path of heat travel. Each stacked channel 44 may be stacked vertically relative to the base plate 46. In contrast, conventional manifold structures that have straight channel walls and are formed by conventional manufacturing methods may not be suitable for building a multi-level manifold structure due to the lesser stiffness and rigidity in the structure.

Figure 8:
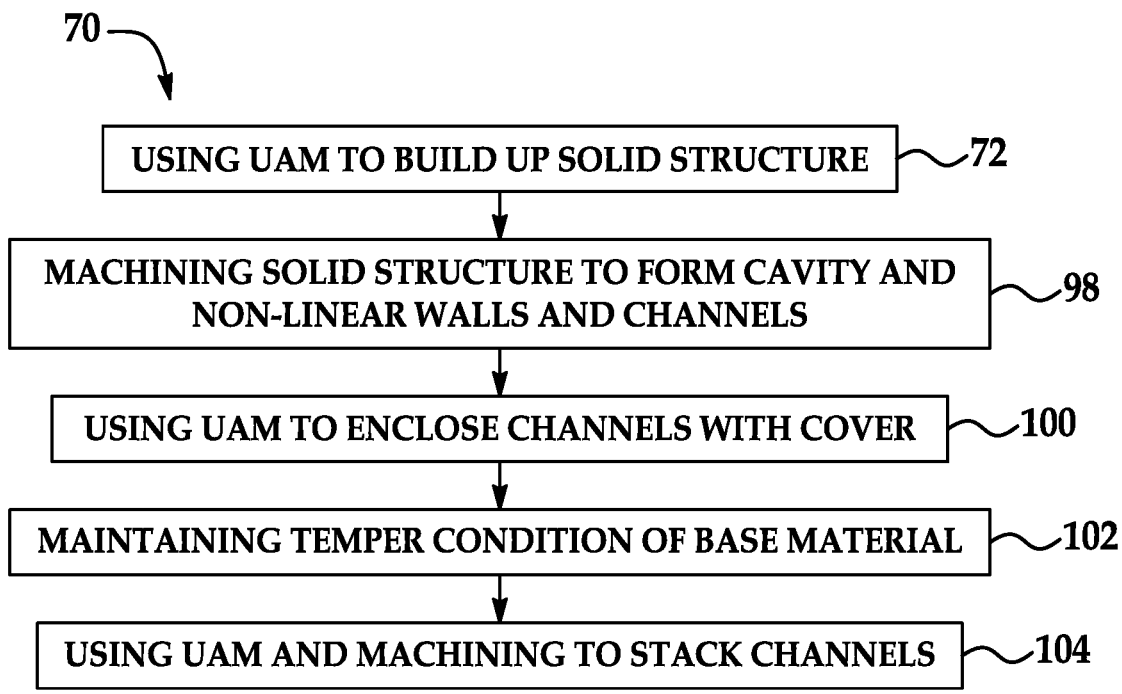
FIG. 8 is a flow chart illustrating a method of forming the manifold structure of FIG. 3.
Figure 9:
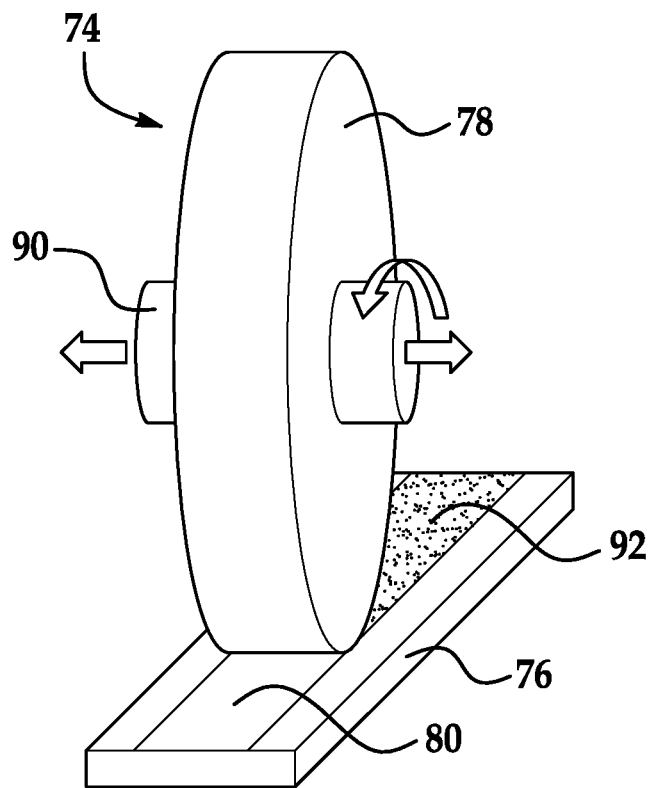
FIG. 9 is a drawing showing an oblique view of a system for performing an ultrasonic additive manufacturing (UAM) process.

Referring in addition to FIGS. 8-11, a method and system for forming the manifold structure 40 are schematically illustrated. FIG. 8 is a flow chart illustrating a method 70 of forming the manifold structure 40. FIGS. 8-11 are schematic drawings illustrating the system used to form the manifold structure 40. Step 72 of the method 70 includes using UAM to build up the solid structure or the body 48 having the base plate 46 (shown in FIG. 3). FIG. 9 is a schematic drawing of a UAM machine 74. The UAM process may be used to build up the part on a base plate material 76 that is an existing part or a portion of an existing structure. The base plate material 76 may be a heated substrate having a temperature in a range from near ambient room temperature up to 200 degrees Celsius. The UAM machine 74 includes a rotatable sonotrode 78 that travels along a length of a tape, or foil 80. The sonotrode 78 is used to apply a force normal to the foil 80 to hold the foil 80 to the base plate material 76 or another foil.

During the movement of the sonotrode 78, the wavy channel pattern advantageously provide stiffness as to prevent buckling of the walls when load is applied but also reduces wall compliance which enhances the scrubbing between the sonotrode 78 and the top foil surface to break the oxide layers. The wavy channels are inherently more stiff when the sonotrode 78 rolls across the surface and also enhances the pressure distribution over the wavy channels. As the sonotrode 78 rolls in the X-direction, the contact area by the sonotrode 78 has less variation when used with the wavy channel walls as compared with straight channel walls, which facilitates a more even load being applied by the machine and therefore less deformation of the walls.

Figure 10:
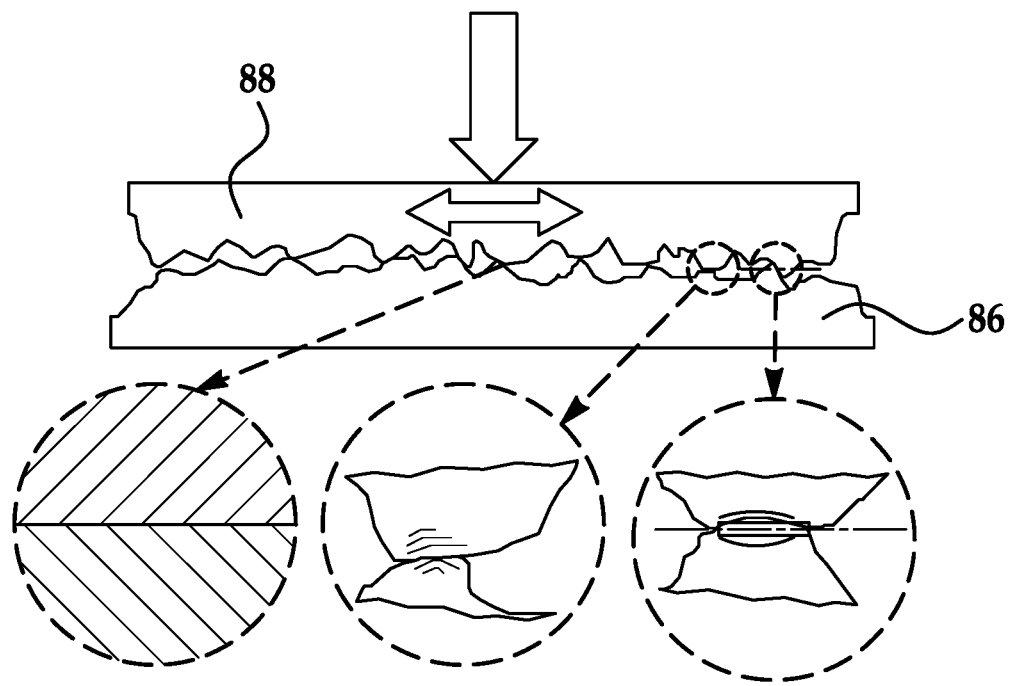
FIG. 10 is a drawing showing an oblique view of metal foil layers that are merged together during the UAM process.
Figure 11:
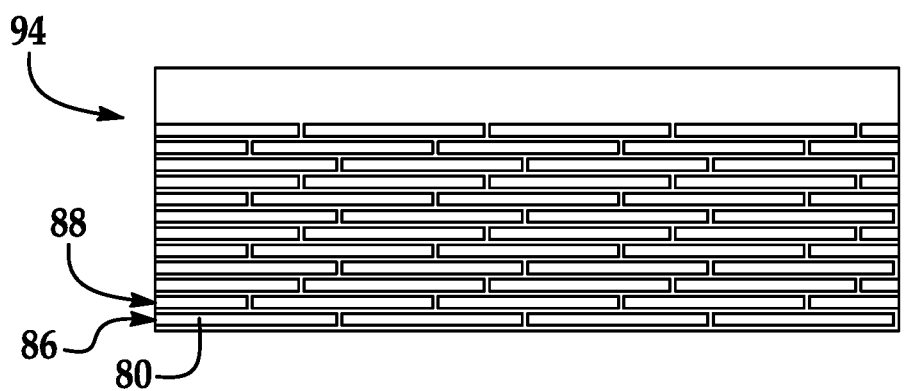
FIG. 11 is a drawing showing a build-up of foil layers during the UAM process.

Step 72 of the method 70 further includes laying the foils 80 side-by-side to form a foil layer, which is repeated to form a plurality of foil layers. After a foil layer 86 is formed, step 72 further includes staggering the foil layers to form a homogenous structure that does not contain gaps between the foils. Referring in addition to FIG. 10, a schematic drawing of the merging or welding of foil layers 86, 88 is shown. The sonotrode 78 may include transducers 90 that produce vibrations to oscillate the sonotrode 78 transversely to the direction of rotation of the sonotrode 78. The sonotrode 78 may oscillate at a constant frequency, such as around 20 kilohertz, to break oxide layers on the foils of the foil layers 86, 88 to be adjoined to form a bonded or welded foil 92. FIG. 11 shows the foils 80 laid side-by-side to form the layers 86, 88. The layers 86, 88 are stacked such that the foils 80 of each layer are staggered. Each layer is welded or merged to a previously formed layer, such that the homogeneous part 94 is formed by building up the layers.

When the homogeneous part or solid structure 94 is formed by the UAM process, step 98 of the method 70 includes machining the solid structure 94 to form an internal geometrical feature of the part 94. Step 98 of the method 70 includes machining a cavity, or flow passage 52 of the manifold structure 40 and machining the wavy channel walls that segment the cavity 52 into wavy channels (shown in FIG. 3). Step 98 further includes forming each wavy channel wall 54 to be sinusoidal in shape and define a period P in a lengthwise direction and an amplitude A in a widthwise direction, with the period P being greater than the amplitude A (shown in FIG. 5). Step 98 may further include angling a peak 56 of each wall 54 between 0 and 45 degrees relative to an adjacent depression 58 of the wall 54. Forming each wavy channel wall 54 using machining is advantageous over conventional brazen support posts of the prior art in that the channel walls may be formed of the same metal material as the part 94, allowing the channel walls to have stronger bonds between the layers of the part 92.

After the wavy channels walls and wavy channels are formed, step 100 of the method 70 includes using the UAM process to build up the cover plate 50 of the manifold structure 40 and enclose each channel 44 (shown in FIG. 3). Step 100 of the method 70 includes laying metal foils side-by-side to form secondary foil layers and step 100 includes staggering the secondary foil layers. Similarly to step 72, the UAM process is used to build-up the cover plate 50 over the channels. Step 102 of the method 70 includes maintaining an original temper condition of the base plate material of the solid structure. The material may be preheated to a predetermined temper condition prior to the UAM process. Maintaining the temper condition of the base plate material is enabled by using UAM which is a low-temperature process as compared with conventional brazing methods used to build up the metal parts. Accordingly, the material properties of the base plate material are advantageously retained and not altered during the manufacturing of the manifold structure 40.

Step 104 of the method 70 may include repeating the UAM process and machining process to form stacked channels 44 that are stacked normal to the fluid flow F and to the base plate 46, as shown in the multi-level manifold structure 40' shown in FIG. 7. The wavy channel walls are formed of any suitable metal material that may have high yield to support UAM pressures of around 2 megapascals (250 pounds per square inch). During the relatively high force applied during the UAM process, prior art brazed posts would buckle or fracture. The waviness of the channels may have a parallel or perpendicular orientation relative to a direction in which the lamination occurs, in contrast to conventional welding processes that require a perpendicular orientation. In exemplary embodiments, wavy channel walls have a higher burst pressure, or failure tolerance, as compared with conventional straight channel walls. For example, the wavy channel walls may have a burst pressure that is between 20% and 50% greater as compared with straight walls of straight channels. In exemplary embodiments, the wavy channel walls may be able to withstand pressures between 2000 and 3500 pounds per square inch.

Another advantage is that the manufacturing process for the manufacturing structure is less complex as compared with conventional manufacturing processes that use UAM and brazing, although brazing may subsequently be used in the present application for additional thermal features in the manifold structure. Using UAM and machining as in the present application enables manufacturing to be performed on a UAM machine and reduces the time for the overall process since the structure and layers do not need to be re-heat treated as compared with conventional brazing processes which requires re-heat treatment of the parts. Consolidating the manufacturing process to a single machine also reduces the opportunities for failure during the manufacturing process. In contrast, conventional OHPs are manufactured using multiple processing operations.

UAM also enables forming the manifold structure by welding of dissimilar metals and multi-material laminates, such that multiple metal foils may be combined. Examples of suitable metal materials for the UAM process include aluminum, beryllium, copper, gold, iron, molybdenum, nickel, palladium, platinum, tantalum, titanium, tungsten, and zirconium. Using a softer material such as copper is particularly enabled by using UAM and may be advantageous for use in small channels for particular applications. Alloys of aluminum, copper, gold, iron, nickel and platinum may also be suitable. In an exemplary embodiment, an aluminum alloy such as 6061-T6 may be used. In an exemplary embodiment using 6061-T6, the layers of the manifold structure may be able to withstand pressures greater than 3000 pounds per square inch. The material may include a ceramic-fiber reinforced metal matrix material. Using multi-materials enables features to be added to the manifold structure to improve thermal performance and functionality of the manifold structure. For example, heat spreaders, thermal interface materials, thermal insulators, and stiffening plates may be added to the manifold structure of the present application.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A manifold structure comprising:
a body having a base plate and a cover plate that define a flow passage therebetween; and
a plurality of walls that segment the flow passage into a plurality of channels, wherein each of the walls has a height extending from the base plate to the cover plate and a non-linear length that is elongated relative to a width of the wall and extends in a direction normal to the height of the wall, wherein each of the walls is sinusoidal in shape and defines a period in a lengthwise direction and an amplitude in a widthwise direction, wherein the amplitude is directly proportional to a stiffness of the wall, and wherein the channels are oscillating heat pipe channels that are formed in the base plate and configured for two-phase passive heat spreading.

2. The manifold structure according to claim 1, wherein the walls are arranged in a corrugated pattern.

3. The manifold structure according to claim 1, wherein the period is defined between two peaks, and wherein each of the two peaks is angled between 0 and 45 degrees in the widthwise direction relative to a depression between the two peaks.

4. The manifold structure according to claim 1, wherein the period is greater than the amplitude.

5. The manifold structure according to claim 1, wherein the amplitude is between 0.7 and 2.1 millimeters.

6. The manifold structure according to claim 1, wherein the period is between 1.0 and 2.3 millimeters.

7. The manifold structure according to claim 1, wherein the walls are arranged in a serpentine pattern.

8. The manifold structure according to claim 1, wherein the base plate and the cover plate are parallel to each other.

9. The manifold structure according to claim 1, wherein the channels are micro-channels.

10. The manifold structure according to claim 1, wherein the manifold structure is a multi-level structure in which the plurality of channels includes stacked channels.

11. A method of forming a metal manifold structure, the method comprising:
using an ultrasonic additive manufacturing process to build up a solid structure having a base plate by applying foils in a layer-by-layer process; and
machining the solid structure to form a cavity that defines a flow passage and a plurality of walls that segment the flow passage into a plurality of channels;
forming each of the walls to be wavy in shape and define a period in a lengthwise direction and an amplitude in a widthwise direction, wherein the period is greater than the amplitude;
using the ultrasonic additive manufacturing process to enclose the channels with a cover plate that is opposite the base plate,
forming the channels as oscillating heat pipe channels in the base plate; and
arranging the oscillating heat pipe channels for two-phase passive heat spreading across the metal manifold structure,
wherein each of the walls has a height extending from the base plate to the cover plate and a non-linear length that is elongated relative to a width of the wall and extends in a direction normal to the height of the wall.

12. The method according to claim 11 further comprising maintaining an original temper condition of the foils during the ultrasonic additive manufacturing process.

13. The method according to claim 11 further comprising forming each of the walls to define the period between two peaks, wherein each of the two peaks is angled between 0 and 45 degrees in the widthwise direction relative to a depression between the two peaks.

14. The method according to claim 11 further comprising forming the channels as micro-channels.

15. The method according to claim 11 further comprising using the ultrasonic additive manufacturing process and machining process to stack a plurality of channels in a direction that is normal to the base plate.

* * * * *